US010379439B2

(12) United States Patent
Worsley et al.

(10) Patent No.: US 10,379,439 B2
(45) Date of Patent: Aug. 13, 2019

(54) ARCHITECTED THREE DIMENSIONAL GRAPHENE VIA ADDITIVE MANUFACTURING

(71) Applicant: LAWRENCE LIVERMORE NATIONAL SECURITY, LLC, Livermore, CA (US)

(72) Inventors: Marcus A. Worsley, Hayward, CA (US); Patrick G. Campbell, Oakland, CA (US); Eric B. Duoss, Dublin, CA (US); James S. Oakdale, Castro Valley, CA (US); Christopher M. Spadaccini, Oakland, CA (US); Ryan Hensleigh, Colstrip, MT (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 231 days.

(21) Appl. No.: 15/400,790

(22) Filed: Jan. 6, 2017

(65) Prior Publication Data

US 2018/0196345 A1 Jul. 12, 2018

(51) Int. Cl.
| | |
|---|---|
| *B33Y 70/00* | (2015.01) |
| *G03F 7/00* | (2006.01) |
| *B33Y 10/00* | (2015.01) |
| *B29C 35/08* | (2006.01) |
| *B01J 13/00* | (2006.01) |

(Continued)

(52) U.S. Cl.
CPC ........ *G03F 7/0037* (2013.01); *B01J 13/0091* (2013.01); *B01J 13/0095* (2013.01); *B29C 35/0805* (2013.01); *B29C 64/129* (2017.08); *B33Y 10/00* (2014.12); *C01B 32/382* (2017.08); *G03F 7/0047* (2013.01); *B29C 2035/0827* (2013.01)

(58) Field of Classification Search
None
See application file for complete search history.

(56) References Cited

U.S. PATENT DOCUMENTS 9,555,583 B1 * 1/2017 Dirk .................... A61N 1/0551
9,708,451 B2 * 7/2017 Lewicki .............. C08K 5/5419
(Continued)

FOREIGN PATENT DOCUMENTS

WO   WO 2016/207355   * 12/2016

OTHER PUBLICATIONS

U.S. Appl. No. 14/820,411, filed Aug. 6, 2015, Lawrence Livermore National Security, LLC.

(Continued)

*Primary Examiner* — Michael A Salvitti
(74) *Attorney, Agent, or Firm* — Foley & Lardner LLP

(57) ABSTRACT

Disclosed here is a method for making an architected three-dimensional aerogel, comprising providing a photoresin comprising a solvent, a photoinitiator, a crosslinkable polymer precursor, and a precursor for graphene, metal oxide or metal chalcogenide; curing the photoresin using projection microstereolithography layer-by-layer to produce a wet gel having a pre-designed three dimensional structure; drying the wet gel to produce a dry gel; and pyrolyzing the dry gel to produce an architected three-dimensional aerogel. Also disclosure is a photoresin for projection microstereolithography, comprising a solvent, a photoinitiator, a crosslinkable polymer precursor, and graphene oxide.

14 Claims, 8 Drawing Sheets

(51) Int. Cl.
*C01B 32/354* (2017.01)
*B29C 64/129* (2017.01)
*G03F 7/004* (2006.01)

(56) References Cited

U.S. PATENT DOCUMENTS

| | | | |
|---|---|---|---|
| 2012/0034442 A1 | 2/2012 | Pauzauskie et al. | |
| 2014/0121425 A1 | 5/2014 | Worsley et al. | |
| 2014/0178289 A1 | 6/2014 | Worsley et al. | |
| 2014/0178759 A1 | 6/2014 | Worsley et al. | |
| 2015/0004087 A1 | 1/2015 | Zettl et al. | |
| 2015/0240035 A1* | 8/2015 | Lewicki | C08K 5/5419 428/195.1 |
| 2016/0010398 A1 | 1/2016 | Nguyen | |
| 2016/0168177 A1* | 6/2016 | Cunningham | G03F 7/027 522/11 |
| 2017/0036915 A1* | 2/2017 | Worsley | C01B 32/182 |
| 2017/0267925 A1* | 9/2017 | Worsley | C09K 11/7701 |
| 2018/0015436 A1* | 1/2018 | Chandrasekaran | C01B 32/05 |
| 2018/0016145 A1* | 1/2018 | Campbell | B01J 13/0091 |
| 2018/0022023 A1* | 1/2018 | Therriault | B29C 64/153 264/460 |
| 2018/0088462 A1* | 3/2018 | Vyatskikh | G03F 7/0042 |
| 2018/0148378 A1* | 5/2018 | Mayr | A61C 13/0013 |
| 2018/0196345 A1* | 7/2018 | Worsley | G03F 7/0037 |
| 2018/0208467 A1* | 7/2018 | Ye | B33Y 10/00 |
| 2018/0327715 A1* | 11/2018 | Espinosa-Hoyos | C12N 5/0622 |

OTHER PUBLICATIONS

U.S. Appl. No. 15/073,400, filed Mar. 17, 2016, Lawrence Livermore National Security, LLC.
Bai et al., "A pH-sensitive graphene oxide composite hydrogel", Chem. Comm., vol. 46, 2010, pp. 2376-2378.
Bai et al., "On the Gelation of Graphene Oxide," The Journal of Physical Chemistry, vol. 115, 2011, pp. 5545-5551.
Balandin et al., "Superior Thermal Conductivity of Single-Layer Graphene," Nano Letters, vol. 8, No. 3, 2008, pp. 902-907.
Barg et al., "Mesoscale assembly of chemically modified graphene into complex cellular networks," Nature Communications, vol. 5, 2014, p. 4328.
Bi et al., "Low temperature casting of graphene with high compressive strength," Advanced Materials, vol. 24, 2012, pp. 5124-5129.
Chen et al., "In situ self-assembly of mild chemical reduction graphene for three-dimensional architectures," Nanoscale, vol. 3, 2011, pp. 3132-3137.
Chen et al., "Fundamentals of double network hydrogels," Journal of Material Chemicals, b 3, 2015, pp. 3654-3676.
Chen et al., "Three-dimensional flexible and conductive interconnected graphene networks grown by chemical vapour deposition", Nature Materials, vol. 10, Jun. 2011, pp. 424-428.
Cong et al., "Graphene-based macroscopic assemblies and architectures: an emerging material system," Chemical Society Reviews, vol. 43, 2014, pp. 7295-7325.
Cong et al., "Macroscopic multifunctional graphene-based hydrogels and aerogels by a metal ion induced self-assembly process," ACS Nano, vol. 6, 2012, pp. 2693-2703.
Geim et al., "The rise of graphene," Nature Materials, vol. 6, Mar. 2007, pp. 183-191.
Geim, A. K., "Graphene: status and prospects", Science, vol. 324, 2009, pp. 1530-1534.
Grundy et al., "Cross-linked polymers of diethynylbenzene and phenylacetylene as new polymer precursors for high-yield synthesis of high-performance nanoporous activated carbons for supercapacitors, hydrogen storage and CO2 capture," Journal of Material Chemistry, 2014, pp. 20316-20330.
Han et al., "Ammonia solution strengthened three-dimensional macro-porous graphene aerogel," Nanoscale, vol. 5, 2013, pp. 5462-5467.

Jakus et al., "Three Dimensional Printing of High-Content Graphene Scaffolds for Electronic and Biomedical Applications", ACS Nano, vol. 9, 2015, pp. 4636-4648.
Lee et al., "Measurement of the Elastic Properties and Intrinsic Strength of Monolayer Graphene," Science, vol. 321, Jul. 2008, pp. 385-388.
Li et al., "Graphene-based materials," Science, vol. 320, 2008, pp. 1170-1171.
Li et al., "Highly conducting graphene sheets and Langmuir-Blodgett films," Nature Nanotechnology, vol. 3, Sep. 2008, pp. 538-542.
Lin et al., "Superhydrophobic Functionalized Graphene Aerogels", ACS Applied Materials and Interfaces, vol. 3, 2011, pp. 2200-2203.
Lin et al., "Pristene Graphene Aerogels by Room-Temperature Freeze Gelation," Advanced Materials, 2016.
Machado et al., "Graphene-based materials for catalysis," Catal. Sci. Technol., vol. 2, 2012, pp. 54-75.
Menaa et al., "Graphene nanomaterials as biocompatible and conductive scaffolds for stem cells: impact for tissue engineering and regenerative medicine," J. Tissue Eng. Regen. Med, doi: 10.1002/term.1910, 2014.
Peigney et al., "Specific surface area of carbon nanotubes and bundles of carbon nanotubes," Carbon, vol. 39, 2001, pp. 507-514.
Puthusseri et al., "3D micro-porous conducting carbon beehive by single step polymer carbonization for high performance supercapacitors: the magic of in situ porogen formation," Energy Environmental Science, vol. 7, 2014, pp. 728-735.
Qiu et al., "Biomimetic superelastic graphene-based cellular monoliths," Nature Communications, vol. 3, 2012, 7 pages.
Ramanathan et al., "Functionalized graphene sheets for polymer nanocomposites," Nature Nanotechnology, vol. 3, Jun. 2008, pp. 327-331.
Saito et al., "Synthesis of Resorcinol Formaldehyde Aerogel Using Photo-Acid Generators for Inertial Confinement Fusion Experiments," in Symposium BB-Aerogels and Aerogel-Inspired Materials, mrsf10-1306-bb04-31, 2011, 6 pages.
Sun et al., "Multifunctional, Ultra-Flyweight, Synergistically Assembled Carbon Aerogels," Advanced Materials, vol. 25, 2013, pp. 2554-2560.
Vickery et al., "Fabrication of Graphene-Polymer Nanocomposites With Higher-Order Three Dimensional Architectures," Advanced Materials, vol. 21, 2009, pp. 2180-2184.
Wang et al., "Freestanding 3D graphene/cobalt sulfide composites for supercapacitors and hydrogen evolution reaction," RSC Advances, vol. 5, No. 9, 2015, pp. 6886-6891.
Wang et al., "Transparent, Conductive Graphene Electrodes for Dye-Sensitized Solar Cells," Nano Letters, vol. 8, No. 1, 2008, pp. 323-327.
Worsley et al., "High Surface Area, $sp^2$-Cross-linked Three-Dimensional Graphene Monoliths," The Journal of Physical Chemistry Letters, vol. 2, 2011, pp. 921-925.
Worsley et al., "Mechanically robust 3D graphene macroassembly with high surface area," Chem. Comm. vol. 48, 2012, pp. 8428-8430.
Worsley et al., "Synthesis of Graphene Aerogel with High Electrical Conductivity," Journal of American Chemical Society, vol. 132, 2010, pp. 14067-14069.
Worsley et al., "Toward Macroscale, Isoptropic Carbons with Graphene-Sheet-Like Electrical and Mechanical Properties," Advanced Functional Materials, vol. 24, 2014, pp. 4259-4264.
Worsley et al., "Synthesis and Characterization of Highly Crystalline Graphene Aerogels," ACS Nano, vol. 8, 2014, pp. 11013-11022.
Xu et al., "Self-Assembled Graphene Hydrogel via a One-Step Hydrothermal Process," ACS Nano, vol. 4, No. 7, 2010, pp. 4324-4330.
Yoo et al., Large Reversible Li Storage of Graphene Nanosheet Families for Use in Rechargeable Lithium Ion Batteries, Nano Letters, vol. 8, No. 8, 2008, pp. 2277-2282.
Zhang et al., "3D Printing of Graphene Aerogels," Small, vol. 12, No. 13, 2016, pp. 1702-1708.

(56) References Cited

OTHER PUBLICATIONS

Zhang et al., "Mechanically strong and highly conductive graphene aerogel and its use as electrodes for electrochemical power sources," Journal of Materials Chemistry, vol. 21, 2011, pp. 6494-6497.
Zhao et al., "Graphene sponge for efficient and repeatable adsorption and desorption of water contaminations," Journal of Material Chemistry, vol. 22, 2012, pp. 20197-20202.
Zheng et al., "Design and optimization of a light-emitting diode projection micro-stereolithography three-dimensional manufacturing system," Review of Scientific Instruments, vol. 83, 2012, p. 125001.
Zheng et al., "Multiscale Metallic Metamaterials," Nature Materials, 2016.
Zheng et al., "Ultralight, ultrastiff mechanical metamaterials," Science, vol. 344, 2014, pp. 1373-1377.
Zhu et al., "Supercapacitors Based on Three-Dimensional Hierarchical Graphene Aerogels with Periodic Macropores," Nano Letters, 2016.
Zhu, Cheng et al., "Highly compressible 3D periodic graphene aerogel microlattices," Nature Communications, vol. 6, 2015, 7 pages.

* cited by examiner

ARCHITECTED THREE DIMENSIONAL GRAPHENE VIA ADDITIVE MANUFACTURING

BACKGROUND

Graphene is an atomically thin, two-dimensional carbon material with highly desirable properties including a large specific surface area, impressive mechanical properties, and high thermal and electrical conductivities. These exceptional properties find widespread applications in diverse fields including catalysis, composites, energy storage and biomedical scaffolds. However, graphene's propensity toward aggregation and restacking can significantly degrade device performance.

An essential prerequisite for graphene's widespread application is the controlled large-scale assembly of two-dimensional graphene building blocks into three-dimensional (3D) structures while maintaining exceptional properties (e.g., large surface area, mechanical properties, etc.). A variety of 3D graphene-based materials are being explored which focus on providing a network of interconnected pores in order to minimize stacking and fully exploit graphene's properties. Within these materials, control of pore morphology and size is critical in order to obtain the desired material properties.

Several synthesis methods for 3D graphene have been proposed, both with and without template guides. For template-guided methods, such as chemical vapor deposition (CVD) coatings on metallic foams, processing has not been scalable, and the materials obtained from these methods are generally brittle under low compression. Template-free approaches are more scalable and versatile with synthesis capable of a wide-range of pore morphologies including ultrafine (<100 nm) to macro (>1 μm).

Chemically derived graphene oxide (GO) based aerogels are the most common 3D graphene in the literature. This method relies on self-assembly or gelation of the GO suspension via hydrothermal reduction, chemical reduction, or direct cross-linking of the GO sheets. Other methods, particularly ice-templating has demonstrated some control over pore morphology; however, the architecture remains largely stochastic resulting in limited mass transport and non-optimal mechanical properties. Thus, the fabrication of 3D graphene materials with tailored macro-architectures via a controllable and scalable assembly method is still a significant challenge.

The properties of cellular solids are largely determined by their chemical composition, porosity, and cell morphologies. In recent years, additive manufacturing (AM) techniques have been utilized to make architected and hierarchical cellular materials structured from the nanometer to the centimeter scale resulting in unique properties otherwise unattainable. Recently, a 3D printing technique based on extrusion known as direct-ink writing (DIW) was utilize to fabricate highly compressible graphene aerogel microlattices and supercapacitors. These graphene aerogels showed improved mechanical strength beyond most bulk stochastic graphene assemblies while maintaining the large surface area of single graphene sheets. However, the DIW technique has limits in materials, scaling, and speed due to its serial nature. Its inks require a gel-based viscoelastic sheer thinning behavior typically accomplished by incorporating diverse fillers which profoundly impact final material processing and performance. Current processes are limited to log-pile like objects, and not true free-form fabrication, severely limiting the potential for the materials.

SUMMARY

One aspect the invention described herein relates to a method for making an architected three-dimensional aerogel, comprising: providing a photoresin comprising a solvent, a photoinitiator, a crosslinkable polymer precursor, and a precursor for graphene, metal oxide or metal chalcogenide; curing the photoresin using projection microstereolithography layer-by-layer to produce a wet gel having an pre-designed three dimensional structure; drying the wet gel to produce a dry gel; and pyrolyzing the dry gel to produce an architected three-dimensional aerogel.

In some embodiments, the solvent comprises an organic solvent.

In some embodiments, the solvent comprises water.

In some embodiments, the photoinitiator is soluble in an organic solvent.

In some embodiments, the photoinitiator is soluble in water.

In some embodiments, the photoinitiator comprises lithium phenyl(2,4,6-trimethylbenzoyl)phosphinate.

In some embodiments, the crosslinkable polymer precursor comprise a non-aromatic prepolymer that is substantially removable by pyrolysis, and/or an aromatic prepolymer.

In some embodiments, the crosslinkable polymer precursor comprises polyethylene glycol diacrylate (PEGDA) and Bisphenol F ethoxylate (2 EO/phenol) diacrylate (BisF).

In some embodiments, the crosslinkable polymer precursor comprises PEGDA, resorcinol and formaldehyde.

In some embodiments, the precursor for graphene, metal oxide or metal chalcogenide comprises graphene oxide.

In some embodiments, the precursor for graphene, metal oxide or metal chalcogenide comprises a metal salt or metal alkoxide.

In some embodiments, the curing step comprises curing the photoresin at a wavelength of 500 nm or less.

In some embodiments, the drying step comprises drying by solvent exchange and/or supercritical drying.

In some embodiments, the pyrolyzing step comprises pyrolyzing in an inert environment at a temperature of 800° C. or more.

Another aspect of the invention relates to an architected three-dimensional aerogel produced by the method described herein.

In some embodiments, the architected three-dimensional aerogel has an electrical conductivity of at least 10 S/m.

In some embodiments, the architected three-dimensional aerogel has a BET surface area of at least 100 $m^2/g$.

In some embodiments, the architected three-dimensional aerogel has a Young's modulus of at least 10 MPa.

In some embodiments, the architected three-dimensional aerogel has a thickness of at least 1 mm.

A further aspect of the invention relates to a photoresin for projection microstereolithography, comprising a solvent, a photoinitiator, a crosslinkable polymer precursor, and graphene oxide.

These and other features, together with the organization and manner of operation thereof, will become apparent from the following detailed description when taken in conjunction with the accompanying drawings.

DETAILED DESCRIPTION

Reference will now be made in detail to some specific embodiments of the invention contemplated by the inventors for carrying out the invention. Certain examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

Introduction

Figure 8:
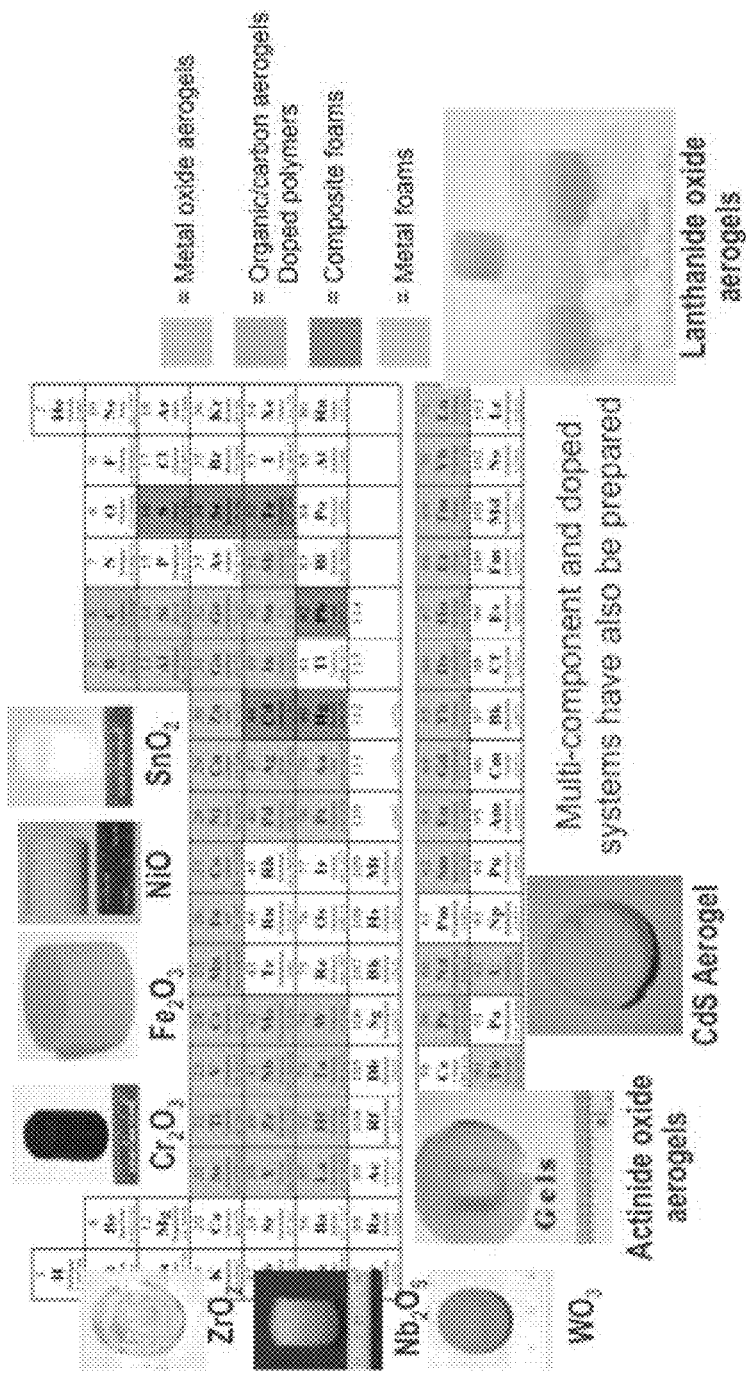
FIG. 8 shows examples of aerogel materials that can be printed via the additive manufacturing process described herein.

Disclosed here are UV-curable sol-gel resins for PµSL applications. These UV-curable sol-gel resins would not only allow the range of elements/compounds manufactured using PµSL to be greatly expanded (FIG. 8), but would also open the door to ultra-lightweight PµSL aerogel structures. Aerogels are typically microporous (pores <2 nm) and mesoporous (pores <50 nm), ultra-lightweight materials that can achieve surface areas in excess of 1000 m$^2$/g. As such, depending on their chemical composition, they are used in a wide range of applications ranging including catalysts and catalyst supports, energy storage and conversion, and sorbents for water purification. Aerogels are made via the sol-gel process, in which a reaction solution is gelled and the solvent is extracted in such a way as to leave the porous solid matrix intact. PµSL produces structures with designed micron-scale features. UV-curable sol-gel for PµSL is capable of producing hierarchical aerogel structures that will significantly expand the application space of PµSL and aerogels.

The article, "Mechanically Robust 3D Graphene Macroassembly with High Surface Area," Worsley et al., Chem. Commun., 48:8428-8430 (2012), is incorporated by reference in its entirety.

The article, "Toward Macroscale, Isotropic Carbons with Graphene-Sheet-Like Electrical and Mechanical Properties," Worsley et al., Adv. Funct. Mater., 24:4259-4264 (2014), is incorporated by reference in its entirety.

The article, "Synthesis and Characterization of Highly Crystalline Graphene Aerogels," Worsley et al., ACS Nano, 8:11013-11022 (2014), is incorporated by reference in its entirety.

US Patent Publication No. 2012/0034442 to Worsley et al., "Graphene Aerogels," is incorporated by reference in its entirety.

US Patent Publication No. 2014/0178289 to Worsley et al., "High-Density 3D Graphene-Based Monolith and Related Materials, Methods, and Devices," is incorporated by reference in its entirety.

US Patent Publication No. 2014/0178759 to Worsley et al., "Graphene-supported metal oxide monolith," is incorporated by reference in its entirety.

US Patent Publication No. 2014/0121425 to Worsley et al., "High surface area graphene-supported metal chalcogenide assembly," is incorporated by reference in its entirety.

US Patent Publication No. 2015/0004087 to Worsley et al., "Crystalline boron nitride aerogels," is incorporated by reference in its entirety.

US Patent Publication No. 2016/0101398 to Worsley et al., "Nanoporous metal-carbon composite," is incorporated by reference in its entirety.

U.S. patent application Ser. No. 14/820,411 to Worsley et al., "Highly Crystalline Graphene Aerogels," is incorporated by reference in its entirety.

U.S. patent application Ser. No. 15/073,400 to Worsley et al., "Monolithic Rare Earth Oxide Aerogels," is incorporated by reference in its entirety.

Photoresin for Projection Microstereolithography

Many embodiments of the invention described herein relate to a photoresin for projection microstereolithography, comprising a solvent, a photoinitiator, a crosslinkable polymer precursor, and a precursor for graphene, metal oxide or metal chalcogenide.

The solvent can comprises, for example, an organic solvent, such as alcohol, dimethylformamide, tetrahydrofuran, ethylene glycol, N-methylpyrrolidone, etc. The solvent can comprises, for example, water. The solvent can comprises, for example, water and at least one organic solvent.

The photoinitiator can be, for example, soluble in an organic solvent such as DMF or alcohol. The photoinitiator can be, for example, soluble in water. The photoinitiator can be, for example, capable of initiating photocuring at a wavelength of 500 nm or less, or 450 nm or less, or 420 nm or less, or 405 nm or less.

In some embodiments, the photoinitiator is a an molecule or system of molecules that will have some absorptivity at 405 nm and that once in the excited state will homolytically fragment to generate radicals. The photoinitiator can be selected from LiTPO (lithium phenyl(2,4,6-trimethylbenzoyl)phosphinate), Irgacure 819 (bis 2,4,6-trimethylbenzoyl phenylphosphine oxide), ITX (2-Isopropyl-thioxanthen-9-one), Camphorquinone, Ethyl 4-(NN-diethylamino)benzoate, Irgacure 369 (2-Benzyl-2-dimethylamino-1-(4-morpholinophenyl)-butanone-1), Irgacure 907 (2-Methyl-1-[4-(methylthio)phenyl]-2-(4-morpholinyl)-1-propane), Irgacure 784 (Bis(eta 5,2,4-cyclopentadien-1-yl) bis [2,6-difluoro-2-(1H-pyrrol-1-yl) phenyl]titatnium), or combinations thereof.

The crosslinkable polymer precursor can comprise, for example, a non-aromatic prepolymer. The non-aromatic prepolymer can be, for example, partially or substantially removable by pyrolysis. The non-aromatic prepolymer can be, for example, soluble in an organic solvent such as DMF or alcohol. The non-aromatic prepolymer can be, for example, soluble in water. The non-aromatic prepolymer can be, for example, a polyethylene glycol (PEG) based polymer such as polyethylene glycol diacrylate (PEGDA). The non-aromatic prepolymer can be, for example, pentaerythritol triacrylate (PETA), trimethylolpropane triacrylate (TMPTA), 1,6-hexanediacrylate (HDDA), any polyfunctional (2 reactive groups or greater) acrylate container prepolymers that also soluble in DMF, or combinations thereof.

The crosslinkable polymer precursor can comprise, for example, an aromatic prepolymer. In some embodiments, the aromatic prepolymer can react/crosslink upon exposure to UV but will also remain to some extent after the pyrolysis/carbonization step. The aromatic prepolymer can be, for example, Bisphenol F ethoxylate (2 EO/phenol) diacrylate (BisF). The aromatic prepolymer can be, for example, BPA derivatives, such as bisphenol A glycerolate dimethacrylate, or aromatic urethane acrylates.

The crosslinkable polymer precursor can comprise, for example, a polymerizable compound such as a sol-gel reactant. The polymerizable compound can comprise, for example, resorcinol-formaldehyde. The polymerizable compound can comprise, for example, resorcinol-furfural, phloroglucinol-formaldehyde, phenol-formaldehyde, cresol-formaldehyde, or phenol-furfuryl alcohol. The polymerizable compound can comprise, for example, an epoxide such as propylene oxide, ethylene oxide, trimethylene oxide, and dimethylene oxide.

The photoresin can further comprise, for example, at least one sol-gel catalyst. The sol-gel catalyst can comprise an acid catalyst. The sol-gel catalyst can comprise a base catalyst. Suitable sol-gel catalysts include, but are not limited to, nitric acid, acetic acid, ascorbic acid, hydrochloric acid, sulfuric acid, sodium carbonate, sodium hydroxide, ammonium hydroxide, and calcium sulfate.

In some embodiments, the photoresin comprises both a non-aromatic prepolymer and an aromatic prepolymer. The crosslinkable polymer precursor can account for, for example, 1-50 wt %, or 2-30 wt %, or 5-20 wt %, or 10-15 wt % of the photoresin. The non-aromatic prepolymer can account for, for example, 1-30 wt %, or 2-20 wt %, or 5-15 wt % of the photoresin. The aromatic prepolymer can account for, for example, 1-30 wt %, or 2-20 wt %, or 5-15 wt % of the photoresin. In some embodiments, the photoresin comprises PEGDA and BisF.

In some embodiments, the photoresin comprises both a non-aromatic prepolymer and a polymerizable compound. The crosslinkable polymer precursor can account for, for example, 1-50 wt %, or 2-30 wt %, or 5-20 wt %, or 10-15 wt % of the photoresin. The non-aromatic prepolymer can account for, for example, 5-30 wt % or 10-20 wt % of the photoresin. The polymerizable compound can account for, for example, 1-10 wt % or 2-5 wt % of the photoresin. In some embodiments, the photoresin comprises PEGDA, resorcinol and formaldehyde.

In some embodiments, the photoresin comprises graphene oxide. The graphene oxide can account for, for example, 0.1-5 wt %, or 0.2-2 wt %, or 0.5-1 wt % of the photoresin. Methods for making GO are known in the art and disclosed in, for example, Hummer, *J. Am. Chem. Soc.,* 80:1339 (1958), which is incorporated herein by reference in its entirety. In some embodiments, the photoresin is prepared by providing an aqueous GO suspension made by sonicating GO in deionized water, and adding crosslinkable polymer precursor, photoinitiator, and any additional component into the aqueous GO suspension. In some embodiments, the photoresin is prepared by providing a non-aqueous GO suspension made by sonicating GO in an organic solvent such as DMF, and adding crosslinkable polymer precursor, photoinitiator, and any additional component into the non-aqueous GO suspension.

In some embodiments, the photoresin comprises a metal salt or metal alkoxide. The metal salt or metal alkoxide can be, for example, a transition metal salt or transition metal alkoxide. The metal salt or metal alkoxide can be, for example, a post-transition metal salt or post-transition metal alkoxide. The metal salt or metal alkoxide can be, for example, a rare-earth metal salt or rare-earth metal alkoxide. The metal salt or metal alkoxide can be, for example, a lanthanide salt or lanthanide alkoxide. The metal salt or metal alkoxide can be, for example, a actinide salt or actinide alkoxide.

Additional embodiments of the invention described herein relate to a photoresin for projection microstereolithography, comprising a solvent, a photoinitiator, and a precursor for metal oxide or metal chalcogenide. In some embodiments, the photoresin comprises a metal salt (e.g. aluminum chloride) and a photoinitiator in an alcoholic (e.g. ethanol) solution. An epoxide (e.g. propylene oxide) may also be added depending on the formulation. In some embodiments, the photoresin comprises a metal alkoxide (e.g. titanium (IV) ethoxide), water, hydrochloric acid, and a photoinitiator in an alcoholic (e.g. ethanol) solution. An epoxide (e.g. propylene oxide) may also be added depending on the formulation.

Method for Making Architected 3D Aerogel

Many embodiments of the invention described herein relate to a method for making an architected three-dimensional aerogel, comprising: providing a photoresin comprising a solvent, a photoinitiator, a crosslinkable polymer precursor, and a precursor for graphene, metal oxide or metal chalcogenide; curing the photoresin using projection microstereolithography layer-by-layer to produce a wet gel having a pre-designed three dimensional structure; drying the wet gel to produce a dry gel; and pyrolyzing the dry gel to produce an architected three-dimensional aerogel.

Projection microstereolithography (PuSL) is a photolithographic additive manufacturing (AM) method whereby a patterned light beam is used to crosslink photoresin and builds an arbitrary three dimensional object layer-by-layer.

The ability of PuSL to build parts across length scales spanning orders of magnitude relatively quickly is unparalleled. Photocurable compositions compatible with photolithographic techniques such as PuSL for making graphene and graphene-based aerogels were unknown prior to the present invention.

As described herein, a photocurable graphene aerogel resin has been developed for the PuSL system and its use to print true free-form architected graphene aerogels. While bulk graphene aerogels exhibit structural features from the nano to the centimeter scale, their stochastic nature cause their strength and stiffness to degrade by more than a factor of $10^8$. The hierarchically structured graphene aerogels produced by PuSL from photocurable graphene aerogel resin exhibit a linear scaling due to this structuring. These aerogels also exhibit exceptional conductivity and surface area.

In some embodiments, the curing step comprises curing the photoresin at a wavelength of 500 nm or less, or 450 nm or less, or 420 nm or less, or 405 nm or less. In some embodiments, the curing step comprises curing the photoresin by UV.

In some embodiments, the wet gel is subjected to solvent exchange to remove reaction by-products. Suitable solvent include, but are not limited to, DI water. In some embodiments, the wet gel is subjected to solvent exchange to remove water. Suitable solvents include, but are not limited to, acetone.

In some embodiments, the wet gel is dried under supercritical condition (e.g., using supercritical $CO_2$). In some embodiments, the wet gel is dried under ambient temperature and pressure. In some embodiments, the wet gel is freeze dried.

In some embodiments, the dry gel is thermally annealed or pyrolyzed in an inert gas (e.g., nitrogen) at a temperature of at least about 600° C., or at least about 800° C., or at least about 1000° C., or at about 1050° C., to produce an architected three-dimensional aerogel.

The pyrolysis may, for example, partially or substantially convert polymers derived from one or more crosslinkable polymer precursors (e.g., resorcinol and formaldehyde) into carbon nanoparticles. The pyrolysis may, for example, partially or substantially remove polymer components derived from a non-aromatic prepolymer (e.g., PEGDA). The pyrolysis may, for example, incorporate aromatic components derived from an aromatic prepolymer (e.g., BisF) into the backbone of the GO/graphene matrix.

Architected 3D Aerogel

Many embodiments of the invention relate to an architected 3D aerogel produced by the method described herein. The 3D aerogel is "architected" in terms of having an arbitrary 3D structure that can be pre-designed as a CAD model and additively manufactured layer-by-layer by projection microstereolithography.

The architected 3D aerogel can comprise, for example, a graphene aerogel or graphene-based aerogel. The graphene component can account for, for example, at least about 30 wt %, or at least about 50 wt %, or at least about 70 wt %, or at least about 90 wt % of the architected 3D aerogel.

The architected 3D aerogel can comprise, for example, a metal oxide aerogel or metal oxide-based aerogel. The metal oxide component can account for, for example, at least about 30 wt %, or at least about 50 wt %, or at least about 70 wt %, or at least about 90 wt % of the architected 3D aerogel. The architected 3D aerogel can be, for example, a transition metal oxide aerogel or transition metal oxide-based aerogel. The architected 3D aerogel can be, for example, a post-transition metal oxide aerogel or post-transition metal oxide-based aerogel. The architected 3D aerogel can be, for example, a rare-earth metal oxide aerogel or rare-earth metal oxide-based aerogel. The architected 3D aerogel can be, for example, a lanthanide oxide aerogel or lanthanide oxide-based aerogel. The architected 3D aerogel can be, for example, an actinide oxide aerogel or actinide oxide-based aerogel.

The architected 3D aerogel can be a monolith having a thickness of, for example, at least about 100 μm, or at least about 1 mm, or at least about 10 mm, or at least about 100 mm, or about 10 μm to about 1 mm, or about 1 mm to about 100 mm.

The architected 3D aerogel can have an electrical conductivity of, for example, at least about 10 S/m, or at least about 20 S/m, or at least about 50 S/m, or at least about 100 S/m, or at least about 200 S/m, or at least about 500 S/m, or about 10-1,000 S/m, or about 20-500 S/m, or about 50-200 S/m.

The architected 3D aerogel can have a Young's modulus of, for example, at least about 10 MPa, or at least about 20 MPa, or least about 50 Mpa, or at least about 100 MPa, or at least about 200 MPa, or at least about 500 MPa, or about 10-1,000 MPa, or about 20-500 MPa.

The architected 3D aerogel can have a BET surface area of, for example, at least about 20 m$^2$/g, or at least about 50 m$^2$/g, or at least about 100 m$^2$/g, or at least about 200 m$^2$/g, or at least about 500 m$^2$/g, or about 50-1,500 m$^2$/g, or about 100-1,000 m$^2$/g.

The architected 3D aerogel can have a mesopore volume of, for example, at least about 0.1 cm$^3$/g, at least about 0.2 cm$^3$/g, or at least about 0.5 cm$^3$/g, or at least about 0.8 cm$^3$/g, or at least about 1 cm$^3$/g, or about 0.1-5 cm$^3$/g, or about 0.2-3 cm$^3$/g, or about 0.5-2 cm$^3$/g.

The architected 3D aerogel can have a density of, for example, about 1 g/cm$^3$ or less, or about 500 mg/cm$^3$ or less, or about 300 mg/cm$^3$ or less, or about 200 mg/cm$^3$ or less, or about 100 mg/cm$^3$ or less, or about 10-500 mg/cm$^3$, or about 20-300 mg/cm$^3$.

The architected 3D aerogel can comprise, for example, a three-dimensional network of graphene sheets interconnected or crosslinked by chemical bonds such as covalent carbon-carbon bonds. In some embodiments, 50% or more, or 70% or more, or 80% or more, or 90% or more of the graphene sheets are directly crosslinked to other graphene sheets. In some embodiments, 50% or more, or 70% or more, or 80% or more, or 90% or more of the graphene sheets are covalently crosslinked. In some embodiments, 50% or more, or 70% or more, or 80% or more, or 90% or more of the covalent bonds interconnecting the graphene sheets are sp$^2$ carbon-carbon bonds. In some embodiments, 20% or less, or 10% or less, or 5% or less of the graphene sheets are interconnected only by physical crosslinks. In some embodiments, 20% or less, or 10% or less, or 5% or less of the graphene sheets are interconnected only by metal crosslinks.

Composite Derivable from Architected 3D Aerogel

Additional embodiments of the invention described herein relate to a composite derived from the architected 3D aerogel.

The composite can comprise, for example, a metal or metal compound deposited or disposed onto the internal surfaces of the architected 3D aerogel. The composite can comprise, for example, a transition metal or metal compound deposited or disposed onto the internal surfaces of the architected 3D aerogel. The composite can comprise, for example, a post-transition metal or metal compound deposited or disposed onto the internal surfaces of the architected 3D aerogel. The composite can comprise, for example, a lanthanide metal or metal compound deposited or disposed onto the internal surfaces of the architected 3D aerogel. The composite can comprise, for example, an actinide metal or metal compound deposited or disposed onto the internal surfaces of the architected 3D aerogel.

The metal or metal compound can be deposited or disposed throughout the entire thickness of the architected 3D aerogel. In some embodiments, the composite comprises a metal nanoparticle deposited or disposed onto the internal surfaces of the architected 3D aerogel. In some embodiments, the composite comprises a metal oxide deposited or disposed onto the internal surfaces of the architected 3D aerogel. In some embodiments, the composite comprises a metal chalcogenide (e.g., a metal sulfide) deposited or disposed onto the internal surfaces of the architected 3D aerogel. In some embodiments, the composite comprises a metal nitride deposited or disposed onto the internal surfaces of the architected 3D aerogel. In some embodiments, the composite comprises a metal carbide deposited or disposed onto the internal surfaces of the architected 3D aerogel. In some embodiments, the composite comprises a metal carbonitride deposited or disposed onto the internal surfaces of the architected 3D aerogel. Methods for depositing the metal or metal compound can be found in U.S. Pat. No. 8,664,143, US Pat. Pub. No. 2014/0121425, US Pat. Pub. No. 2014/0178759, and U.S. Pat. Pub. No. 2016/0101398, each of which is incorporated herein by reference in its entirety.

The composite can comprise, for example, a silicon or boron compound deposited or disposed onto the internal surfaces of the architected 3D aerogel. The silicon or boron compound can be deposited or disposed throughout the entire thickness of the architected 3D aerogel. In some embodiments, the composite comprises a silicon compound (e.g., silicon oxide, silicon carbide, silicon nitride) deposited or disposed onto the internal surfaces of the architected 3D aerogel. In some embodiments, the composite comprises a boron compound (e.g., boron nitride) deposited or disposed onto the internal surfaces of the architected 3D aerogel. Methods for depositing or deriving the silicon or boron compound can be found in U.S. Pat. No. 8,629,076 and US Pat. Pub. No. 2015/0004087, each of which is incorporated herein by reference in its entirety.

The composite can comprise, for example, a polymer deposited or disposed onto the internal surfaces of the architected 3D aerogel. The polymer can be deposited or disposed throughout the entire thickness of the architected 3D aerogel. In some embodiments, the composite comprises polydimethylsiloxane or epoxy deposited or disposed onto the internal surfaces of the architected 3D aerogel. Methods for depositing the polymer can be found in U.S. Pat. No. 9,087,625, which is incorporated herein by reference in its entirety.

Applications

The architected 3D aerogels described herein exhibit exceptional conductivity and surface area, which with the flexibility of the PuSL printing technique makes them suitable materials for supercapacitors, sensors, catalysts, catalyst supports, batteries, sorbents, filtration/separation, capacitive desalination, hydrogen storage, and tissue scaffolds of custom designed architectures and geometries.

WORKING EXAMPLES

Example 1—Preparation of Photocurable Graphene Aerogel Resin with BisF/PEGDA Hybrid Graphene oxide (GO) was suspended in dimethylformamide (DMF) and thoroughly dispersed using a VWR Scientific Model 75T Aquasonic (sonic power ~90 W, frequency ~40 kHz) for 24 hours. The concentration of GO in the reaction mixture was held at 1 wt %. To the dispersed GO, a range of weight percentages 1-12 wt % Bisphenol F ethoxylate (2 EO/phenol) diacrylate (BisF) with average molar mass (Mn)~484 (Sigma) and 4-11.5 wt % PEGDA of various Mn, 700 and 575, were added so that the total amount of polymer added equaled 12 wt %. To this mixture 0.02 g of the photo-initiator lithium phenyl(2,4,6-trimethylbenzoyl)phosphinate) (TPO-Li, Colorado Photopolymer Solutions) was dissolved.

Example 2—Preparation of Photocurable Graphene Aerogel Resin with RF Hydrogel GO was dispersed in deionized water via ultrasonication for 24 hours keeping the concentration of GO fixed at 1 wt %. Once the GO was dispersed, varying amounts, 1-4 wt % of resorcinol and formaldehyde (RF) were added. For reference 4 wt % RF with 20 wt % PEGDA consisted of: resorcinol (1.235 g, 11.2 mmol), formaldehyde (1.791 g, 22.1 mmol), sodium carbonate catalyst (5.95 mg, 0.056 mmol), and polyethylene glycol diacrylate (PEGDA) with either Mn ~700 or Mn ~575 (0.4 g, 280 mmol) were added to 1.5 grams of the GO solution. The resorcinol-to-catalyst ratios (R:C) employed was 200. A range of resorcinol and formaldehyde (RF solids) tested was between 1-4 wt %.

Example 3—Three-Dimensional Printing of Graphene Aerogel

Figure 1:
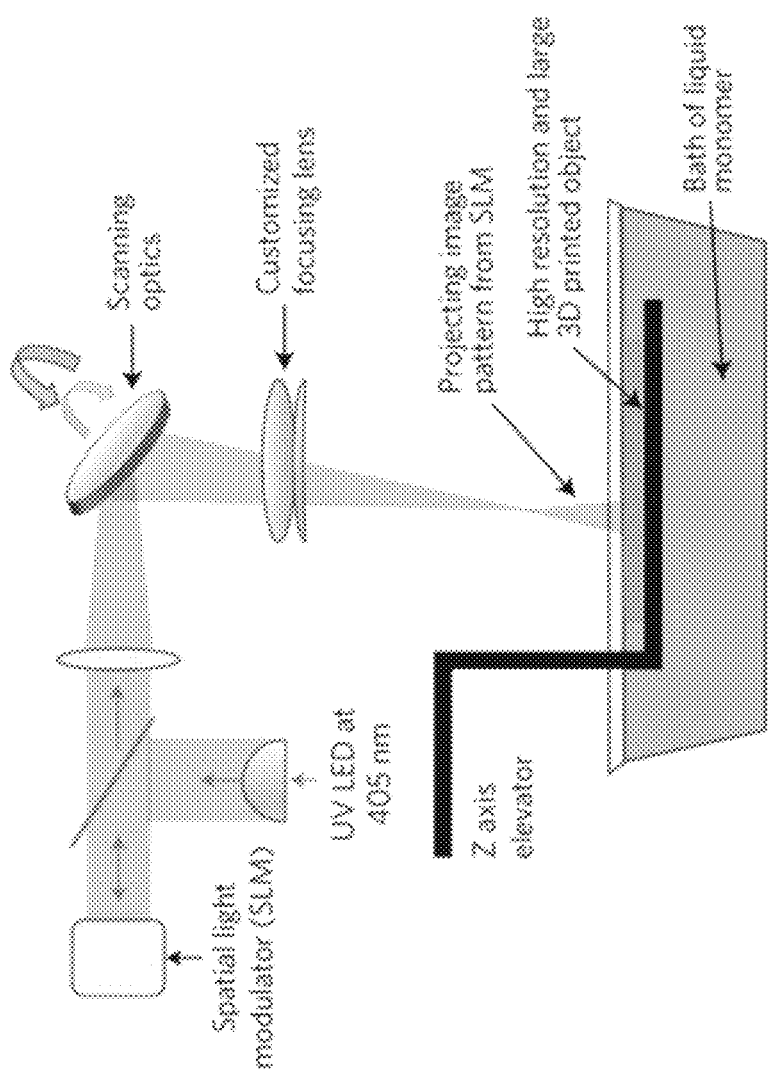
FIG. 1 shows schematic of a projection microstereolithography (PuSL) process. A 3D CAD model is generated and sliced into layers. Each layer is used to digitally pattern a dynamic photomask. The photomask patterns the beam which is scanned by a galvanometer mirror onto a photocurable resin. Actuation in the Z direction allows layers-by-layer stacking of 2D images into a 3D object.

To print structures, a custom built system shown schematically in FIG. 1 was used, equipped with a 405 nm light source. A three-dimensional CAD model was sliced vertically into a series of layers. Using a spatial light modulator (SLM) as a dynamically reconfigurable digital photomask, each two-dimensional image slice was sequentially transmitted to the SLM which took on the pattern of the image. UV light illuminated the SLM from a photodiode, and a patterned beam was reflected. The patterned beam was reflected by a galvanometer mirror pair onto a flat-field scan lens which flattened the images and acted as a reduction optic before passing the light onto the photoresin. Where two-dimensional image hit the resin a solid forms. The galvanometer mirror and scan lens allowed the patterned 2D image to be scanned over a large area, creating a mosaic of highly detailed cells. Subsequently, the substrate on which the layer rests was lowered, reflowing a thin film of liquid over the cured layer. The image projection was then repeated, with the next image slice forming the subsequent layer.

Example 4—Supercritical Drying and Carbonization

RF hybrid gels required an additional processing step, whereby the gels are placed into octane, and put into an 80° C. oven for one day to fully crosslink the RF network. BisF/PEGDA Hybrid gels did not undergo this step. The resulting gels were then washed with acetone for 24 hours to remove all the water from the pores of the gel network. The wet gels were subsequently dried with supercritical $CO2$ and pyrolyzed at 1050° C. under a $N_2$ atmosphere for 3 hours, ramping up and down at 2° C. per minute. The graphene aerogel materials were isolated as black 3D carbon structures.

Example 5—Results with BisF/PEGDA Hybrid

Through a simple concentration gradient, it was found that ~12 wt % acrylate polymer is the minimum required in order to crosslink a 1 wt % GO solutions into a solid gel using BisF. BisF was chosen because of its aromatic structure and mechanically robust gels which when crosslinked give strong structural support. For graphene aerogel synthesis, some bridging carbon is required when GO is not covalently crosslinked in order to maintain aerogel porosity and structure, but too much fills pores leaving a solid amorphous carbon material. The desired material therefore, is the strongest possible to allow robust printing, while incorporating as little polymer as possible.

As the minimum amount of polymer needed to make a printable gel was 12 wt % using BisF, this was the first gel tested and a solid carbon monolith resulted. It was suspected the aromatic structure of BisF leads to a relatively high conversion to carbon compared to non-aromatic polymers. Probing other polymers, various molecular weights of polyethylene glycol diacrylate (PEGDA) were tested due to their common use in hydrogels particularly with low (10-20 wt %) polymer concentration and its ability to cleanly burn out during carbonization. However, pure PEGDA graphene hydrogels are not robust, warping during supercritical drying and carbonization, often leaving only graphene dust after processing.

Figure 2:
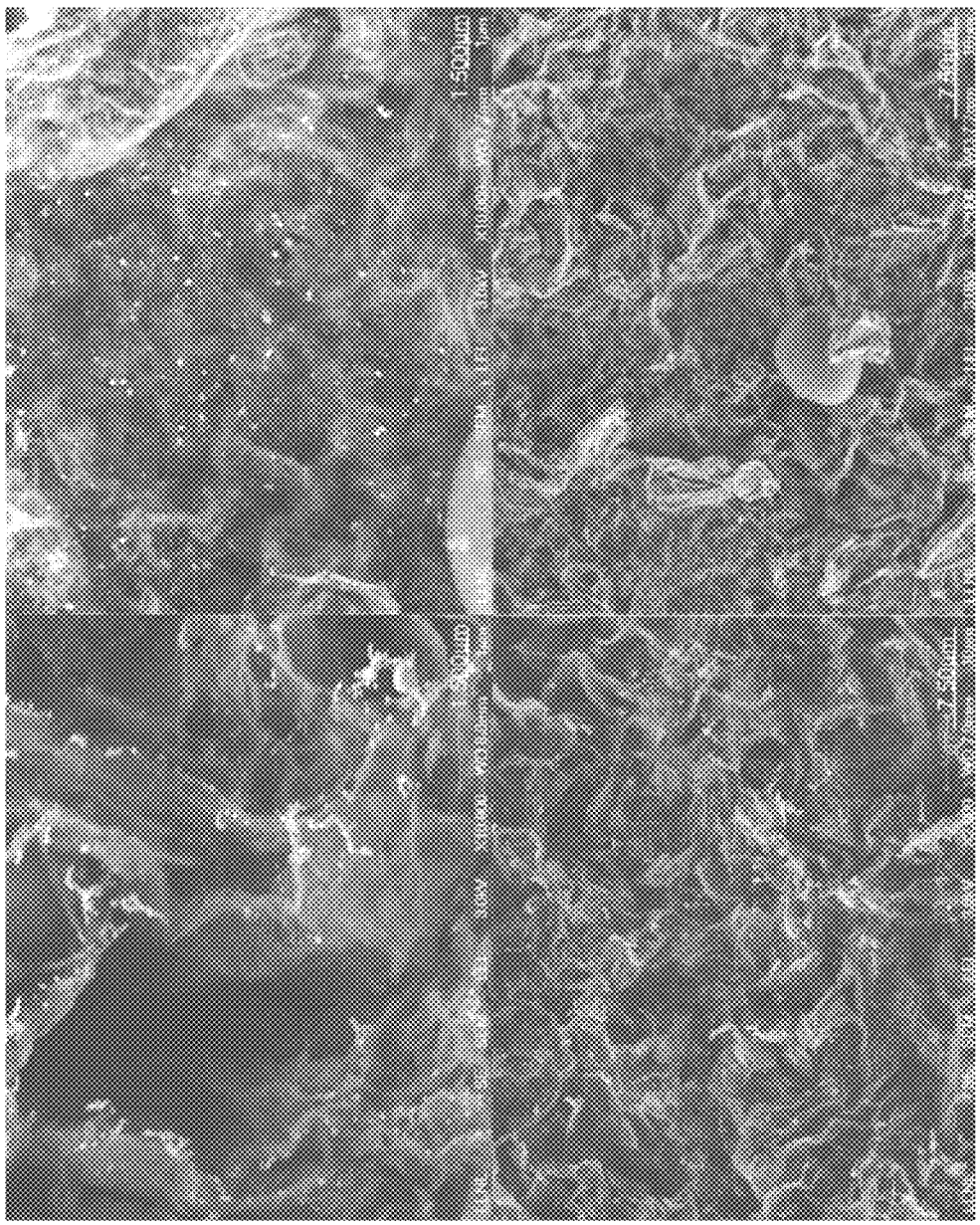
FIG. 2 shows images of 1% BisF, 11% PEGDA, and 1% GO after carbonization (left) images of the same material but with an increase in PEGDA to 23% (right). The aerogel porosity is filled with excess carbon due to the increase in PEGDA content.

To overcome these limitations, various amounts PEGDA were blended with BisF to make a hybrid resin. Gaining the strength of BisF while using the fact that PEGDA burns out more completely, leaving less carbon than pure BisF during carbonization. FIG. 2 shows the effects of increasing the amount of PEGDA from 11 wt % to 23 wt % while keeping BisF and GO fixed at 1 wt %. The lower 12 wt % total polymer content gel shows aerogel like porosity, while the 24 wt % total polymer content shows the pores between graphene sheets filled with amorphous carbon.

Figure 3:
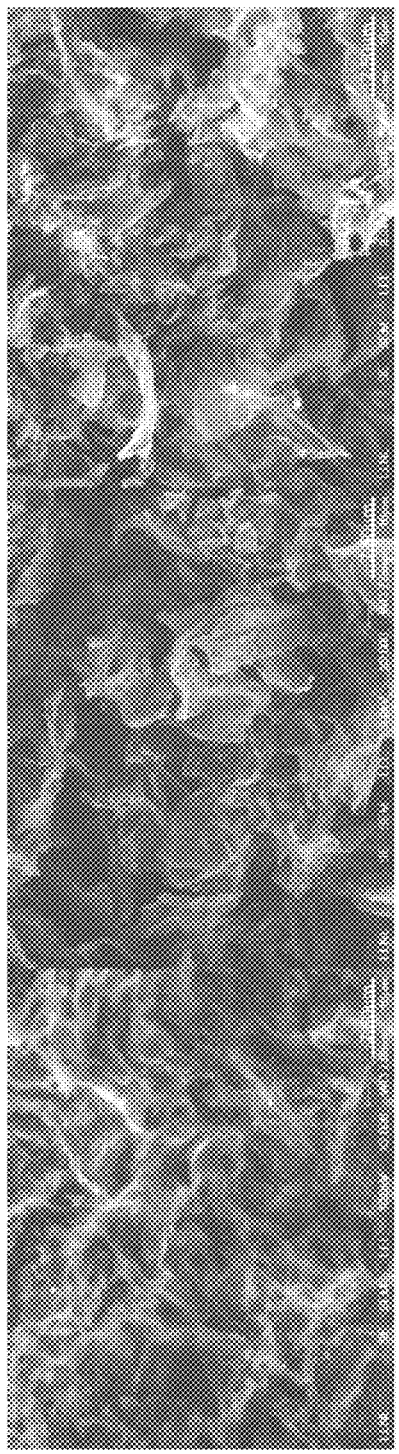
FIG. 3 shows images after UV curing, supercritical drying, and carbonization. (A) BisF 2 wt %, PEGDA 700 10 wt %, and GO 1 wt %; (B) BisF 6 wt %, PEGDA 700 6 wt %, GO 1 wt %; (C) BisF 8 wt %, PEGDA 700 4 wt %, GO 1 wt %.

While the 1% BisF and 11% PEGDA show good porosity, they form only weak gels upon UV curing. A more robust gel is desired, hence the content of BisF was increased, maintain the total polymer content at 12 wt % to maintain the porosity. FIG. 3 shows increases in the BisF content at 3, 6, and 10 wt % with the corresponding wt % of PEGDA to equal 12 wt % total.

The 6 wt % BisF and 6 wt % PEGDA appear very similar to previous graphene aerogels. The 2 wt % BisF and 10 wt % PEGDA appear that the graphene sheets are beginning to restack, perhaps indicating a lack of strong bridging carbon to support the porous network while the 8 wt % BisF and 3 wt % PEGDA there appears to be an increase in amorphous carbon filling the pores.

Figure 4:
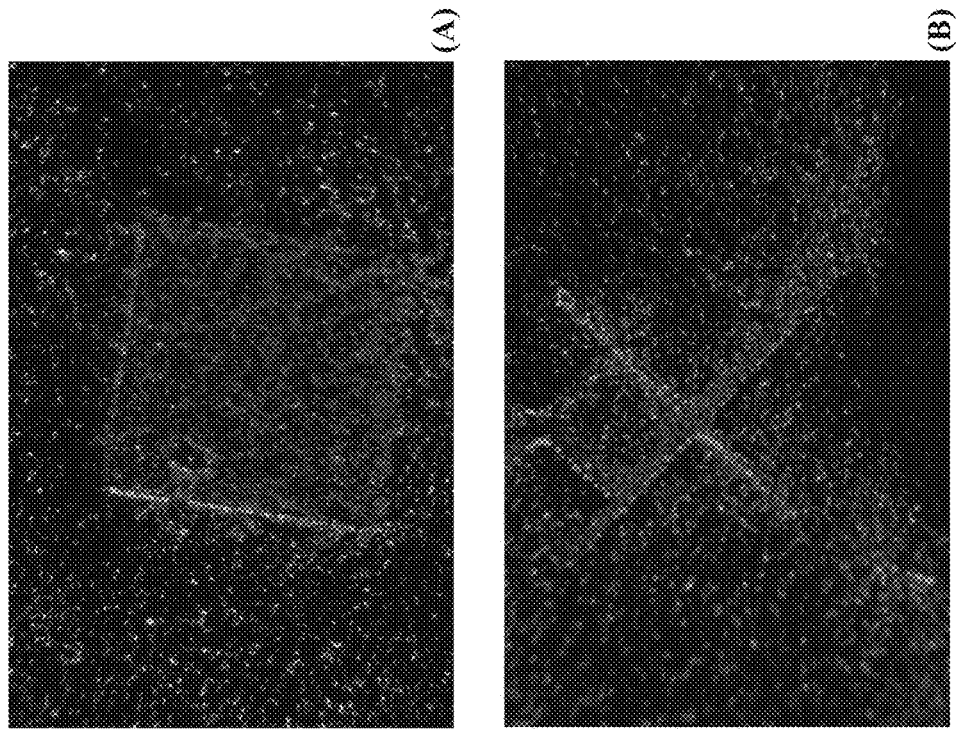
FIG. 4 shows exposures of a photoresin on a custom made second generation photolithography machine. (A) shows a square projection, while (B) shows an "X" projection. Layer thickness on the order of 10-100 microns.

Due to its promising microstructure, a photoresin of 6 wt % BisF and 6 wt % PEGDA was pursued. FIG. 4 shows exposures of this photoresin on a custom made second generation photolithography machine. The top image shows a square projection, while the second an "X" projection. Layer thickness on the order of 10-100 microns.

Figure 5:
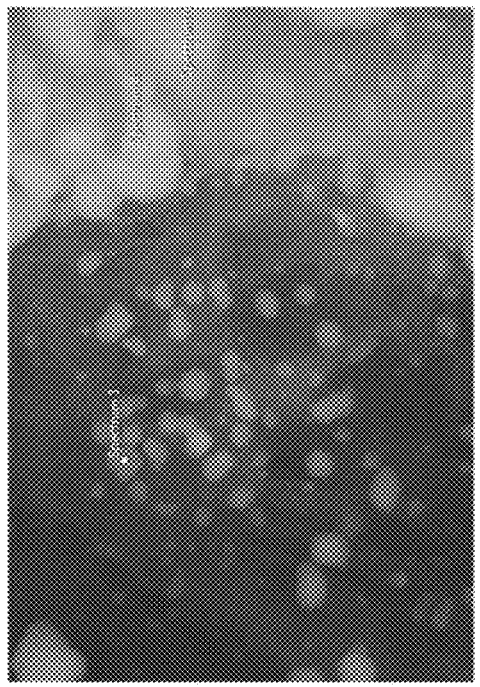
FIG. 5 shows EDS analysis of white globules revealing a high oxidized carbon content indicating that they are carbon nanoparticles formed during carbonization. Such particles have been noticed in previous studies.
Figure 5:
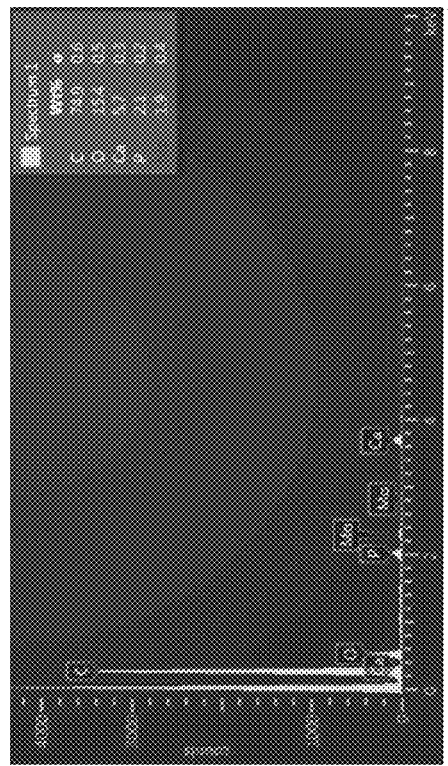

Most of the BisF/PEGDA Hybrid carbonized gels exhibited white globules on the surface. These were analyzed by EDS and the spectrum appears in FIG. 5. The globules are inorganic, exhibiting large amounts of oxidized carbon with some increase in metal content indicating that these are carbon nanoparticles which have been observed previously in carbon/graphene aerogels.

Example 6—Results with RF Hydrogel

RF resins have been used previously to form graphene based carbon aerogels. These systems are not UV curable in the time scales necessary for PuSL (<1 min, preferably faster). Therefore a hydrogel formulation based on acrylate photocurable hydrogel was repurposed giving the fast curing ability of acrylates, with the robust aerogel integrated bridging structure afforded by RF. A unique photocured and thermally post-cured double network hydrogel was shown to exhibit highly desirable mechanical properties.

Figure 6:
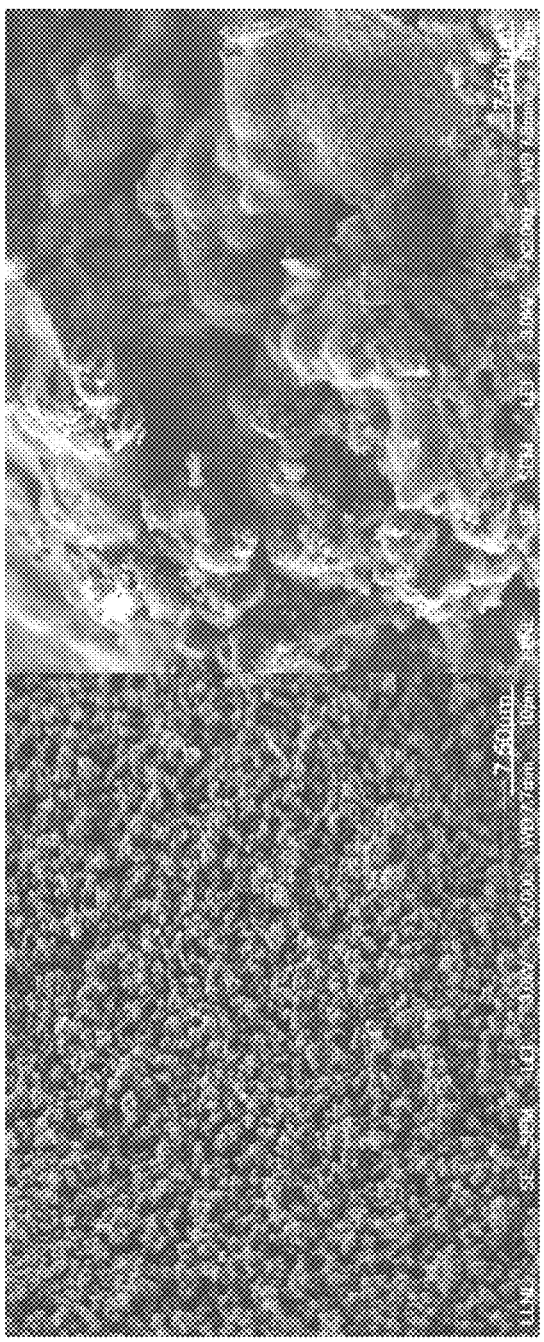
FIG. 6 shows (A) 3 wt % RF, 20 wt % PEGDA 700, and 0.5 wt % GO after carbonization, and (B) the same formulation but with 4 wt % RF. The small increase in RF lead to a dense carbon product.

Similar to BisF/PEGDA system, it was the main concern to have the strongest gel with the least amount of polymer. The solubility of resorcinol and formaldehyde (RF) is limited in PEGDA solution and it was found increasing amounts of RF were needed in order to make a homogenous solution. For PEGDA 700, a minimum of 3 wt % RF was needed, while for PEGDA 575, 2 wt % could be used. FIG. 6 shows the difference between 3 wt % and 4 wt % RF with 20 wt % PEGDA 700 and 0.5 wt % GO.

Figure 7:
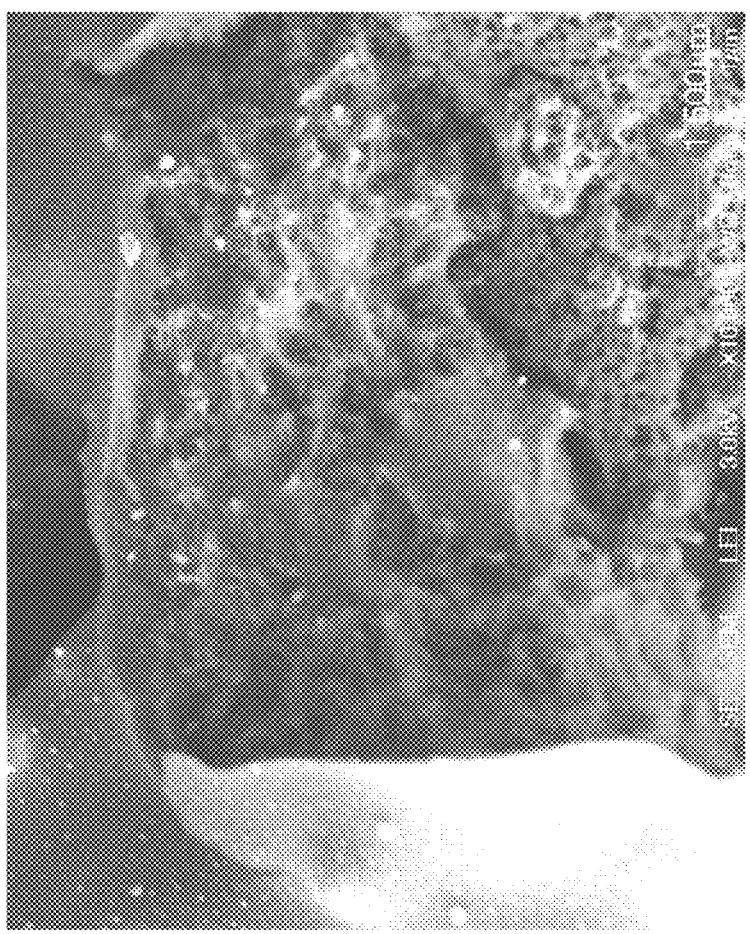
FIG. 7 shows 4 wt % RF with 20 wt % PEGDA 700, fast cured in 3.0 M NaOH, mL, for 5 min at room temperature, supercritically dried and carbonized.

A faster RF curing method was also tested, whereby the 4 wt % RF with PEGDA 700 was soaked in 3.0 M NaOH for 5 minutes. Concentrated base or acid causes a rapid gelation of RF, allowing us to skip the 80° C. post cure in iso-octane. The results of this experiment are shown in FIG. 7, showing mostly dense but possibly closed-cell nanoporous features.

Example 7—Conclusion

Graphene is a two-dimensional material that offers a unique combination of low density, exceptional mechanical properties, large surface area and excellent electrical conductivity. Previous reports have produced 3D graphene aerogels (GAs) with architectural control accomplished by additive manufacturing (AM) known as direct-ink writing (DIW). These 3D printed GAs exhibit superior properties to their stochastic bulk counterparts due to the effects of micro-architecture control. However, DIW has several intrinsic limitations which limit the full realization of 3D architected GAs potential. Disclosed here is the use of projection microstereolithography, an AM technique that is unparalleled in its ability to print across orders of magnitude in length quickly, to additively manufacture graphene aerogel. This flexible technique allows printing of architected graphene aerogels which exhibit impressive mechanical and electrical properties while being ultra-light and high surface area. The improvement of 3D structured GAs through architecture AM opens up the full potential of GA.

As used herein, the singular terms "a," "an," and "the" include plural referents unless the context clearly dictates otherwise. Thus, for example, reference to a molecule can include multiple molecules unless the context clearly dictates otherwise.

As used herein, the terms "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

In the foregoing description, it will be readily apparent to one skilled in the art that varying substitutions and modifications may be made to the invention disclosed herein without departing from the scope and spirit of the invention. The invention illustratively described herein suitably may be practiced in the absence of any element or elements, limitation or limitations, which is not specifically disclosed herein. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention. Thus, it should be understood that although the present invention has been illustrated by specific embodiments and optional features, modification and/or variation of the concepts herein disclosed may be resorted to by those skilled in the art, and that such modifications and variations are considered to be within the scopes of this invention.

What is claimed is:

1. A method for making an architected three-dimensional aerogel, comprising:
   providing a photoresin comprising a solvent, a photoinitiator, a crosslinkable polymer precursor, and a precursor for graphene, metal oxide or metal chalcogenide; wherein the crosslinkable polymer precursor comprises (a) polyethylene glycol diacrylate (PEGDA) and Bisphenol F ethoxylate (2 EO/phenol) diacrylate (BisF), or (b) PEGDA, resorcinol and formaldehyde;
   curing the photoresin using projection microstereolithography layer-by-layer to produce a wet gel having a pre-designed three dimensional structure;
   drying the wet gel to produce a dry gel; and
   pyrolyzing the dry gel to produce an architected three-dimensional aerogel.

2. The method of claim 1, wherein the solvent comprises an organic solvent.

3. The method of claim 1, wherein the solvent comprises water.

4. The method of claim 1, wherein the photoinitiator is soluble in an organic solvent.

5. The method of claim 1, wherein the photoinitiator is soluble in water.

6. The method of claim 1, wherein the photoinitiator comprises lithium phenyl(2,4,6-trimethylbenzoyl)phosphinate.

7. The method of claim 1, wherein the crosslinkable polymer precursor comprise a non-aromatic prepolymer that is substantially removable by pyrolysis, and/or an aromatic prepolymer.

8. The method of claim 1, wherein the crosslinkable polymer precursor comprises polyethylene glycol diacrylate (PEGDA) and Bisphenol F ethoxylate (2 EO/phenol) diacrylate (BisF).

9. The method of claim 1, wherein the crosslinkable polymer precursor comprises PEGDA, resorcinol and formaldehyde.

10. The method of claim 1, wherein the precursor for graphene, metal oxide or metal chalcogenide comprises graphene oxide.

11. The method of claim 1, wherein the precursor for graphene, metal oxide or metal chalcogenide comprises a metal salt or metal alkoxide.

12. The method of claim 1, wherein the curing step comprises curing the photoresin at a wavelength of 500 nm or less.

13. The method of claim 1, wherein the drying step comprises drying by solvent exchange and/or supercritical drying.

14. The method of claim 1, wherein the pyrolyzing step comprises pyrolyzing in an inert environment at a temperature of 800° C. or more.

* * * * *